(12) United States Patent
Hubert et al.

(10) Patent No.: US 10,991,710 B2
(45) Date of Patent: Apr. 27, 2021

(54) NON-VOLATILE MEMORY DEVICE WITH VERTICAL STATE TRANSISTOR AND VERTICAL SELECTION TRANSISTOR

(71) Applicant: STMicroelectronics (Rousset) SAS, Rousset (FR)

(72) Inventors: Quentin Hubert, Marseilles (FR); Abderrezak Marzaki, Aix en Provence (FR); Julien Delalleau, Marseilles (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/391,768

(22) Filed: Apr. 23, 2019

(65) Prior Publication Data
US 2019/0341390 A1 Nov. 7, 2019

(30) Foreign Application Priority Data
May 4, 2018 (FR) ...................................... 1853887

(51) Int. Cl.
*H01L 27/1157* (2017.01)
*G11C 5/06* (2006.01)
*H01L 27/11565* (2017.01)

(52) U.S. Cl.
CPC .......... *H01L 27/1157* (2013.01); *G11C 5/063* (2013.01); *H01L 27/11565* (2013.01)

(58) Field of Classification Search
CPC .......... H01L 27/1157; H01L 27/11565; H01L 29/42344; H01L 29/42352; H01L 27/11568; H01L 29/4136; H01L 29/66833; H01L 29/42348; H01L 29/7927; H01L 29/7926; H01L 29/40117; H01L 29/42332; H01L 29/78889; H01L 29/42328; H01L 20/42328; H01L 29/42336; G11C 5/065; G11C 5/063; G11C 5/06
USPC ........................................................ 257/314
See application file for complete search history.

(56) References Cited

U.S. PATENT DOCUMENTS

| 5,739,567 | A | 4/1998 | Wong | |
|---|---|---|---|---|
| 7,126,188 | B2 | 10/2006 | Shone | |
| 8,885,407 | B1 | 11/2014 | Ratnam | |
| 9,330,763 | B1* | 5/2016 | Zhang | G11C 16/26 |
| 9,941,293 | B1* | 4/2018 | Pang | H01L 27/11519 |
| 2004/0130934 | A1* | 7/2004 | Prall | H01L 29/7889 365/154 |
| 2004/0180496 | A1 | 9/2004 | Hsiao et al. | |

(Continued)

FOREIGN PATENT DOCUMENTS

DE 102004006505 A1 9/2005

OTHER PUBLICATIONS

Kim, Yoon, et al., "Gated Twin-Bit Silicon-Oxide-Nitride-Oxide-Silicon NAND Flash Memory for High-Density Nonvolatile Memory," Japanese Journal of Applied Physics, vol. 54, No. 6, Jun. 1, 2015, 6 pages.

*Primary Examiner* — Alexander O Williams
(74) *Attorney, Agent, or Firm* — Slater Matsil, LLP

(57) ABSTRACT

A non-volatile memory device includes a vertical state transistor disposed in a semiconductor substrate, where the vertical state transistor is configured to trap charges in a dielectric interface between a semiconductor well and a control gate. A vertical selection transistor is disposed in the semiconductor substrate. The vertical selection transistor is disposed under the state transistor, and configured to select the state transistor.

21 Claims, 9 Drawing Sheets

(56) References Cited

U.S. PATENT DOCUMENTS

| | | | |
|---|---|---|---|
| 2005/0127428 A1* | 6/2005 | Mokhlesi | H01L 29/66825 257/315 |
| 2005/0189582 A1 | 9/2005 | Mikolajick | |
| 2005/0275002 A1 | 12/2005 | Shone | |
| 2006/0128104 A1* | 6/2006 | Prall | H01L 27/115 438/279 |
| 2007/0187746 A1 | 8/2007 | Kashimura | |
| 2009/0251973 A1 | 10/2009 | Satoh | |
| 2010/0117141 A1* | 5/2010 | Shin | H01L 27/11582 257/326 |
| 2013/0069137 A1* | 3/2013 | Pekny | H01L 27/11556 257/319 |
| 2013/0228846 A1* | 9/2013 | La Rosa | G11C 16/14 257/321 |
| 2013/0229875 A1* | 9/2013 | La Rosa | G11C 16/24 365/185.21 |
| 2013/0250700 A1* | 9/2013 | La Rosa | H01L 29/788 365/185.29 |
| 2014/0097481 A1* | 4/2014 | La Rosa | G11C 16/0433 257/315 |
| 2014/0191291 A1* | 7/2014 | La Rosa | H01L 27/11556 257/242 |
| 2015/0035034 A1* | 2/2015 | Winstead | H01L 29/42328 257/314 |
| 2015/0236031 A1* | 8/2015 | Mantelli | H01L 27/11521 365/185.28 |
| 2015/0243675 A1* | 8/2015 | Lim | H01L 29/4975 257/324 |
| 2016/0148691 A1* | 5/2016 | Rabkin | G11C 16/10 365/185.19 |
| 2016/0172368 A1* | 6/2016 | Pang | H01L 27/11582 257/314 |
| 2017/0194056 A1* | 7/2017 | Heinrich-Barna | G11C 16/10 |
| 2017/0278736 A1* | 9/2017 | Iwasaki | H01L 21/6773 |
| 2017/0309339 A1* | 10/2017 | Hsiung | G11C 16/10 |
| 2018/0151584 A1* | 5/2018 | La Rosa | H01L 27/11563 |
| 2019/0035480 A1* | 1/2019 | Lu | G11C 11/5671 |
| 2019/0067274 A1* | 2/2019 | Marzaki | H01L 21/306 |
| 2019/0103467 A1* | 4/2019 | Takaki | H01L 27/249 |
| 2019/0244970 A1* | 8/2019 | Jung | H01L 27/11565 |
| 2019/0259462 A1* | 8/2019 | Lu | G11C 8/08 |
| 2019/0267096 A1* | 8/2019 | Yang | G11C 16/32 |
| 2019/0312050 A1* | 10/2019 | Lai | H01L 23/528 |
| 2019/0319044 A1* | 10/2019 | Harari | H01L 27/11573 |
| 2019/0371402 A1* | 12/2019 | Lin | G11C 5/063 |
| 2020/0044095 A1* | 2/2020 | Wang | H01L 27/10876 |

* cited by examiner

FIG.5
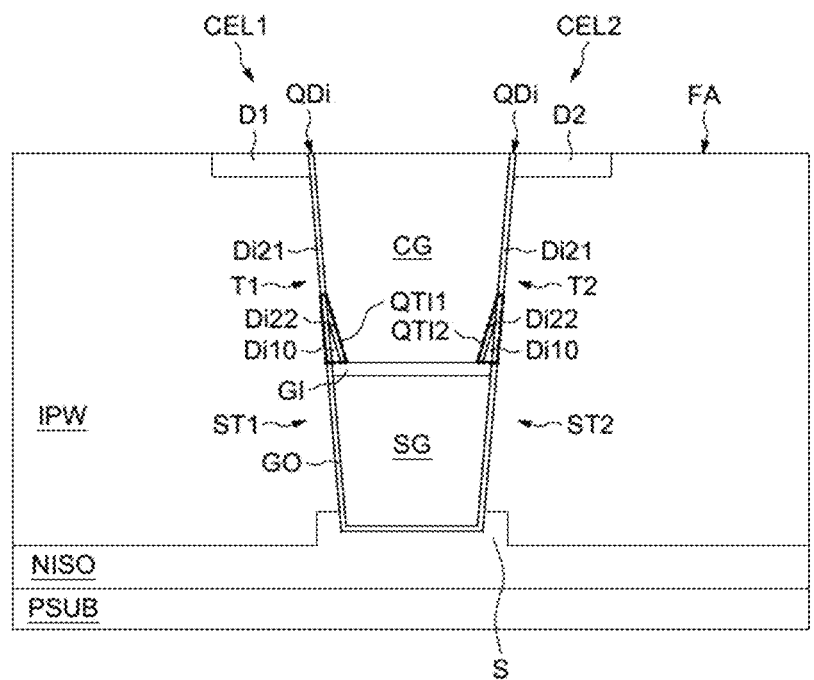
FIG.6
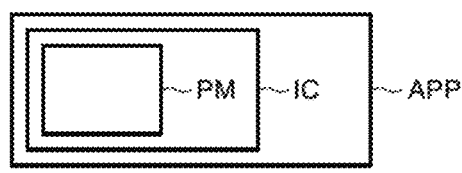
FIG.7
| | CG | SG | D | S | IPW |
|---|---|---|---|---|---|
| Wr | 5/10 | Vsg | 3/4,5 | 0 | 0 |
| Er | -10 | 5/10 | 5/10 | 5/10 | 5/10 |
| Rd | Vcg | Vsg_rd | 0,4/0,7 | 0 | 0 |

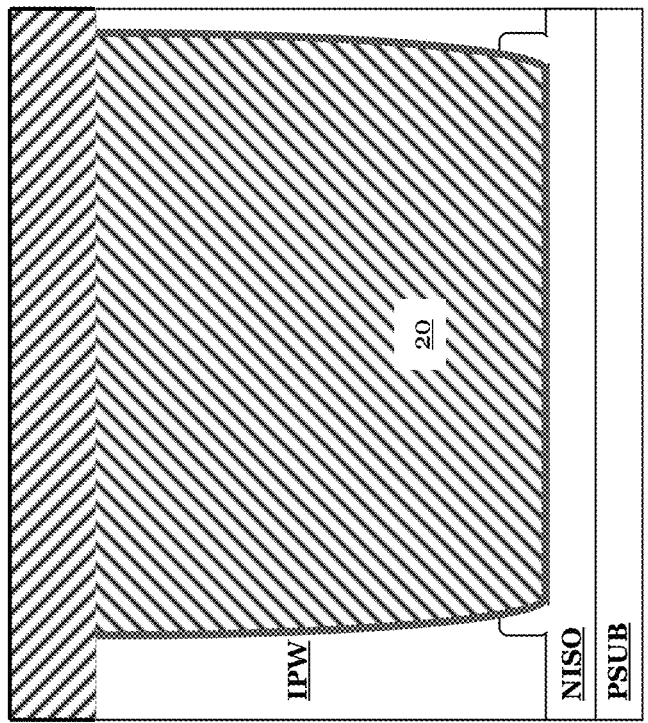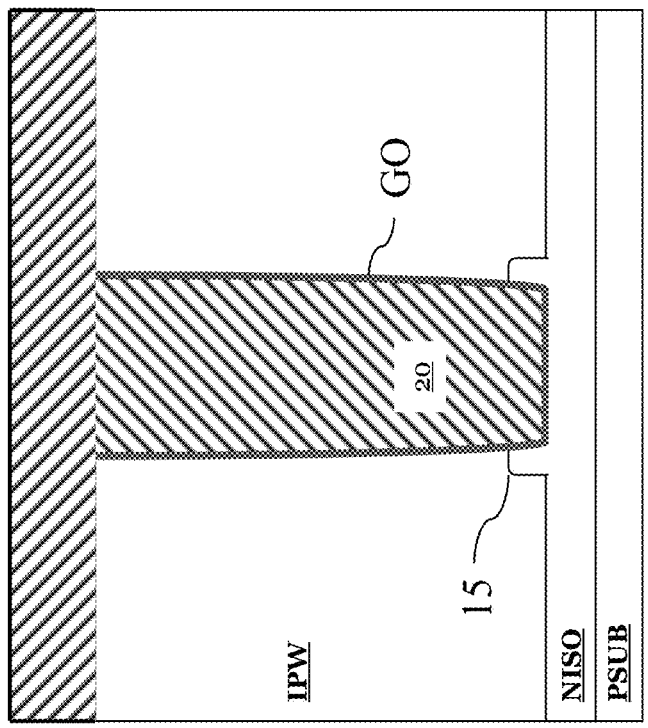

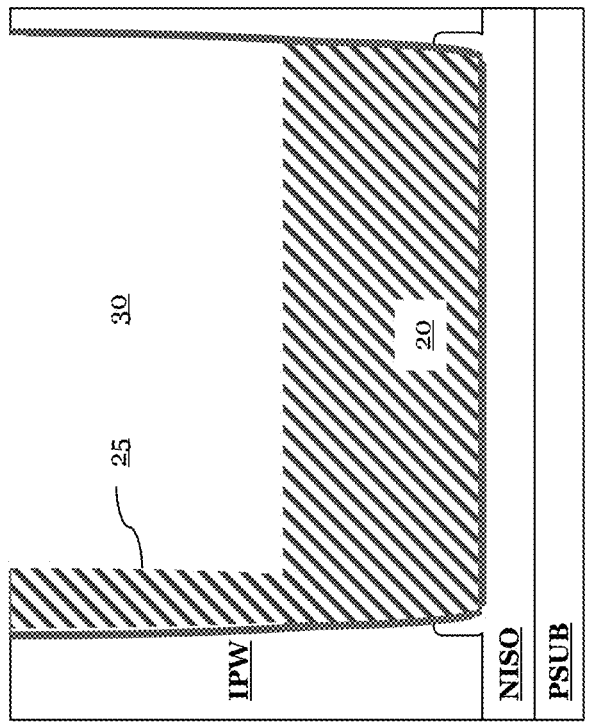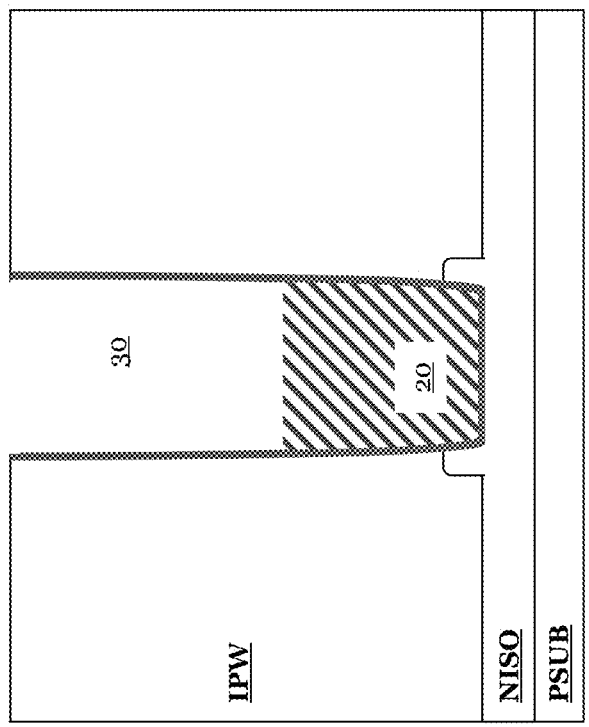

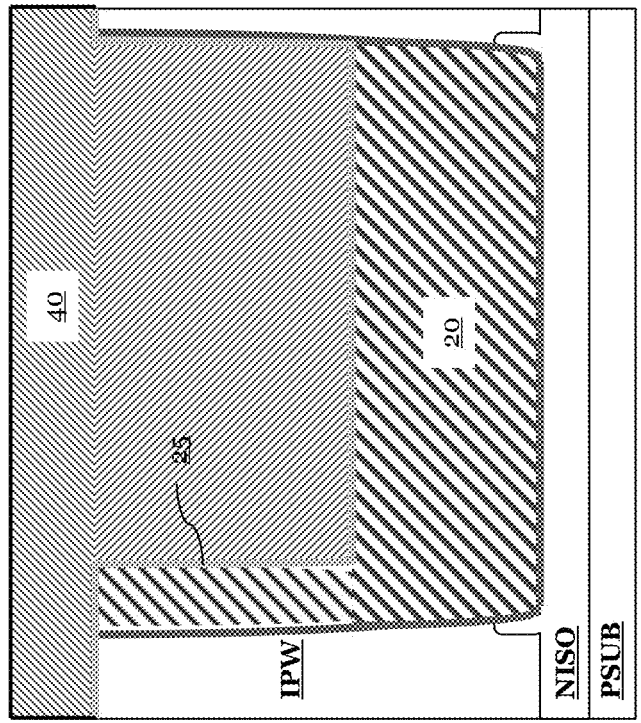
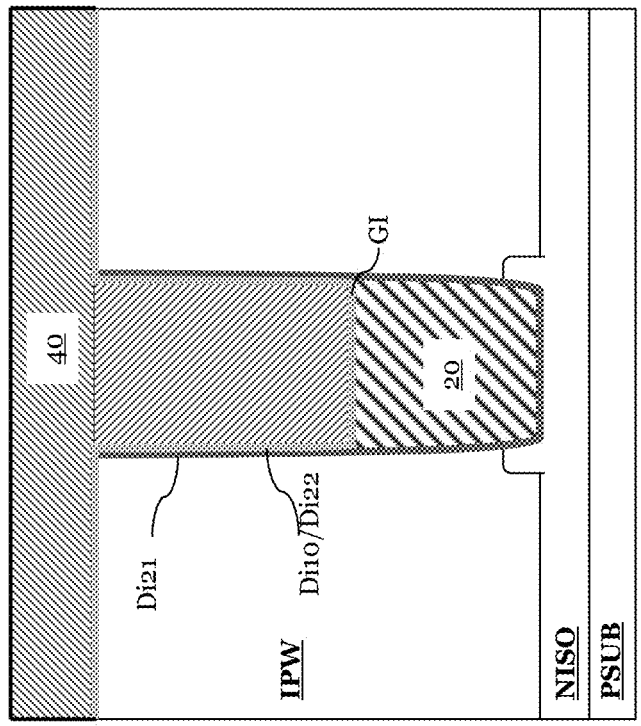

NON-VOLATILE MEMORY DEVICE WITH VERTICAL STATE TRANSISTOR AND VERTICAL SELECTION TRANSISTOR

CROSS-REFERENCE TO RELATED APPLICATIONS

This application claims the benefit of French Application No. 1853887, filed on May 4, 2018, which application is hereby incorporated herein by reference.

TECHNICAL FIELD

The present invention relates generally to semiconductors, and, in particular embodiments, to non-volatile memory device and manufacturing method.

BACKGROUND

Non-volatile memory cells of the type for trapping charges in a dielectric interface, better known to a person skilled in the art as "SONOS" or even "MONOS" depending on the material used for the control gate, typically comprise a control gate separated from the well by a dielectric interface configured to trap electric charges.

Generally, such an interface comprises a layer for storing charges, for example, of silicon dioxide located on a tunnel dielectric layer, for example, formed by silicon dioxide, and under a blocking dielectric layer, for example, also formed by silicon dioxide.

If the control gate is made of polycrystalline silicon, then reference is made to a "SONOS" (silicon-oxide-nitride-oxide-silicon) device, whereas if the control gate is at least partially metal, then reference is made to a device of the "MONOS" (metal-oxide-nitride-oxide-silicon) type.

The patent application filed in the U.S. Ser. No. 15/810,979 (US Patent Publication 2018-0151584) discloses examples of memory cells of the type for trapping charges in a dielectric interface, in which an overlap, by the charge trapping dielectric area and by the control gate, of the common embedded selection gate with two twin memory cells allows the memory device to be rendered more compact.

SUMMARY

In one embodiment, a non-volatile memory device includes a vertical state transistor disposed in a semiconductor substrate, where the vertical state transistor is configured to trap charges in a dielectric interface between a semiconductor well and a control gate. A vertical selection transistor is disposed in the semiconductor substrate. The vertical selection transistor is disposed under the state transistor, and configured to select the state transistor.

In another embodiment, a memory plane comprises rows and columns of memory cells, where the columns comprise twin memory cell units. Each of the twin memory cell units comprise two selection transistors having a common selection gate, two state transistors having a common control gate superposing the common selection gate, and two charge trapping dielectric interfaces disposed on either side of the control gate. The two charge trapping dielectric interfaces are respectively dedicated to each of the twin memory cell units. Each of the two charge trapping dielectric interfaces comprise a dielectric area located between the common control gate and a semiconductor well.

In another embodiment, a method for manufacturing a non-volatile memory device includes forming a trench extending vertically in a semiconductor well of a semiconductor substrate, forming a source region at the bottom of the trench, and forming a gate dielectric layer around sidewalls of the trench. The method further includes forming, in the trench, a selection gate, the gate dielectric layer disposed between the semiconductor well and the selection gate. The method also includes forming a dielectric area on the sidewalls of the trench above the selection gate, the dielectric area comprising two charge trapping dielectric interfaces; and forming, above the selection gate in the trench, a control gate, the control gate being laterally surrounded by the two charge trapping dielectric interfaces.

BRIEF DESCRIPTION OF THE DRAWINGS

Further advantages and features of the invention will become apparent upon reading the detailed description of embodiments, which are by no means limiting, and with reference to the accompanying drawings, in which:

FIGS. 1 to 7 show embodiments of the invention including a pair of memory cells $CEL_1$, $CEL_2$ of the SONOS type for trapping charges in a dielectric interface having a vertical structure, wherein FIG. 1 is a section view in the I-I plane of FIG. 4 of the pair of memory cells $CEL_1$, $CEL_2$, i.e. a vertical section view in the width of the trench, wherein FIG. 2 shows a section view in the II-II plane of FIG. 4 of the pair of memory cells $CEL_1$, $CEL_2$, i.e. a vertical section view in the length of the trench, wherein FIG. 3 shows a section view in the III-III plane of FIG. 4, i.e. a vertical section in the width of the trench, longitudinally offset relative to the I-I plane, wherein FIG. 4 shows a top view of the pair of memory cells $CEL_1$, $CEL_2$ in the memory plane PM in the vicinity of the front face FA delimiting an upper surface of the well IPW in the IV-IV plane of FIGS. 1, 2 and 3, wherein FIG. 5 shows variations of the previously described embodiment, wherein FIG. 6 shows an example of a non-volatile memory device IC comprising a memory plane PM comprising rows RG and columns COL of memory cells, and wherein FIG. 7 shows a table of examples of voltage values in volts (V) to be applied to the control gate CG, the selection gate SG, the drain area D, the source area S and the well IPW, in order to implement programming Wr, erasing Er and reading Rd of data in a memory cell.

FIGS. 8A-8F illustrate a semiconductor memory during various stages of fabrication in accordance with embodiments of the present invention, wherein FIGS. 8A-8F correspond to the section view in the I-I plane of FIG. 4; and FIGS. 9A-9F illustrate a semiconductor memory during various stages of fabrication in accordance with embodiments of the present invention, wherein FIGS. 9A-9F correspond to the section view in the II-II plane of FIG. 4.

DETAILED DESCRIPTION OF ILLUSTRATIVE EMBODIMENTS

Figure 1:
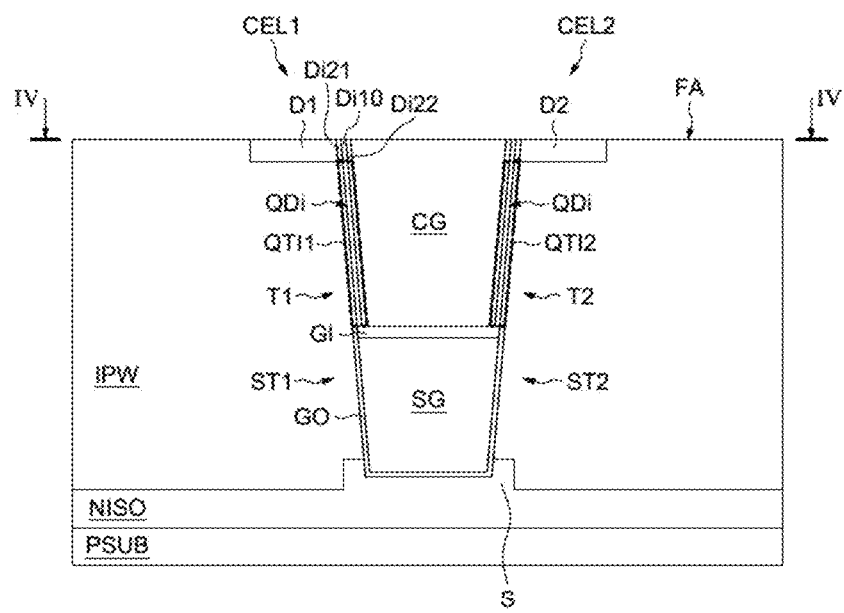

There is a constant requirement for reducing the sizes of the components of integrated circuits, and particularly of providing non-volatile memory devices of the type for trapping charges in a dielectric interface that are even more compact.

The embodiments of the invention relate to non-volatile memory devices, particularly devices of the type for trapping charges in a dielectric interface and having a vertical structure embedded in a semiconductor well.

According to one aspect, a non-volatile memory device is proposed comprising memory cells of the type for trapping charges in a dielectric interface embedded in a semiconductor well.

Each memory cell is advantageously of the "split gate" type, each comprising a state transistor that can be selected by a selection transistor.

Moreover, according to one embodiment, the selection transistor is a vertical selection transistor advantageously embedded in the well and located under the state transistor, i.e. at a distance from the upper face of the well that is greater than the distance separating the state transistor from this upper face.

This selection transistor-state transistor stack renders the memory cell even more compact.

According to one embodiment, each memory cell comprises a state transistor having a control gate and a dielectric area located between the control gate and the well and forming said charge trapping dielectric interface.

According to one embodiment, the selection transistor comprises a selection gate, with the control gate superposing the selection gate.

According to a particular embodiment, a non-volatile memory device is proposed comprising a memory plane comprising rows and columns of memory cells of the type for trapping charges in a dielectric interface, each memory cell comprising a vertical state transistor embedded in a well and comprising an embedded control gate, each memory cell being able to be selected by a vertical selection transistor embedded in the well and comprising an embedded selection gate, the columns of memory cells comprising pairs of twin memory cells, the two selection transistors of a pair of twin memory cells having a common selection gate, the two state transistors of a pair of twin memory cells having a common control gate superposing the common selection gate, the device further comprising, for each pair of twin memory cells, two dielectric areas, located between the common control gate and the well, forming, on either side of the control gate, two charge trapping dielectric interfaces respectively dedicated to the two twin memory cells.

In other words, the control gate and the selection gate of the twin memory cells are superposed and are fully embedded in the well, for example, in a structure of the trench type. Such an embodiment, comprising a pair of vertically structured memory cells, is advantageous in terms of the surface footprint and allows easier integration, for example, in CMOS technology. Furthermore, each memory cell of the pair of twin memory cells is capable of storing digital information by means of the respective charge trapping dielectric interface, which is advantageous in terms of the density of the memory.

According to one embodiment, each state transistor of a pair of twin memory cells comprises a respective drain area located in the vicinity of a front face delimiting an upper surface of the well.

Thus, each memory cell of the pair of memory cells can be accessed independently of the other memory cell, for example, by means of dedicated control voltages applied to said drain areas.

According to one embodiment, each selection transistor of a pair of twin memory cells comprises a source area belonging to an embedded semi-conductive area located in the well in the vicinity of the bottom of the common selection gate.

Such a memory cell, provided with such a selection transistor and a source area belonging to an embedded semi-conductive area, also denoted "source plane", particularly provides an NOR type memory configuration, advantageously allowing page erasures and advantageously using hot-carrier injection programming.

According to one embodiment, the memory plane comprises two bit lines per column of memory cells, with the two memory cells of a pair of twin memory cells being respectively connected to the two bit lines.

For example, it is the drain area of each memory cell of the pair of twin memory cells that is connected to the respective bit line, the bit line being able to route dedicated control voltages, for example.

According to one embodiment, in which the well comprises lateral isolation areas, the control gate extends less deeply in the well than the lateral isolation areas.

The lateral isolation areas typically can be of the Shallow Trench Isolation (STI) type.

This embodiment particularly allows the appearance of a parasitic current between two adjacent memory cells in a row to be avoided, particularly during a writing operation.

According to one embodiment, said charge trapping dielectric interfaces are located on a local part of the sides of the common control gate, in the vicinity of the common selection gate and at a distance from a front face delimiting an upper surface of the well.

In other words, the charge trapping dielectric interfaces are located in the vicinity of the bottom of the control gate area, laterally between said control gate and the well.

This allows trapped charges to be located while reducing the available storage volume, which allows a phenomenon of spreading the location of the trapped charges to be avoided, which phenomenon can degrade the performance of the device.

According to one embodiment, said charge trapping dielectric interfaces comprise semiconductor nanocrystals that are made of silicon, for example.

The term nanocrystal is understood to be a nanometric sized isolated crystalline structure, such as an isolated grain of a polycrystalline material. Such nanocrystals can be obtained by means of short growth by Chemical Vapor Deposition (CVD).

The use of such nanocrystals also allows the location of the trapped charges to be constrained and thus avoids potential degradation of the performance of the device.

According to one embodiment, the device comprises a connection area providing electrical continuity between the selection gate and a contact zone located in the vicinity of a front face delimiting an upper surface of the well.

According to one embodiment, said dielectric area forming said charge trapping dielectric interfaces has a first dielectric layer intended to trap electric charges, surrounded by two second dielectric layers.

According to one embodiment, the control gate comprises polycrystalline silicon, the first dielectric layer comprises silicon nitride and the second dielectric layers comprise silicon oxide.

According to another aspect, a method is proposed for manufacturing a pair of twin memory cells comprising: forming a trench extending vertically in a semiconductor well; forming, in said trench, an embedded selection gate common to two vertical selection transistors embedded in the well and respectively belonging to each memory cell of said pair of twin memory cells. The method further comprises forming a dielectric area comprising, on the sides of the trench above the embedded selection gate, two charge trapping dielectric interfaces respectively belonging to each memory cell of said pair of twin memory cells; and forming, above said selection gate in said trench. An embedded control gate common to two vertical state transistors is embedded in the well and respectively belonging to each memory cell of said pair of twin memory cells. The common embedded control gate being at least partially laterally surrounded by said two charge trapping dielectric interfaces.

According to one embodiment, said formation of said common embedded selection gate comprises: depositing an excessive amount of a selection gate conductor material overflowing said trench above a front face delimiting an upper surface of the well; flattening this excessive amount to the level of the front face; selectively etching a thickness below the depth of the trench of the selection gate conductor material remaining in said trench. The selective etching is anisotropic and hidden facing a connection area located at a longitudinal end of the trench, the non-etched connection area providing electrical continuity between the selection gate and a contact area located in the vicinity of the front face of the well.

According to one embodiment, the method comprises forming two drain areas adjoining the trench, on either side of the trench and in the vicinity of a front face delimiting an upper surface of the well, respectively belonging to each memory cell of said pair of twin memory cells.

According to one embodiment, the method comprises forming an embedded semiconductor area located in the vicinity of the bottom of the trench, forming a source area common to the memory cells of said pair of twin memory cells.

The embodiments of the method according to this aspect have the particular advantage of being dissociated (i.e. implemented separately) from the manufacture of other conventional elements of integrated circuits, such as, for example, the logic elements belonging to the control parts of a memory integrated circuit. Indeed, such a dissociated implementation allows the interactions between the method according to this aspect and the manufacturing steps of the other elements of the same integrated circuit to be limited. Furthermore, such a dissociated implementation is adapted to technologies on a carrier substrate of the Fully-Depleted Silicon On Insulator (FDSOI) type.

The memory cells are of the type for trapping charges in a dielectric interface, for example, of the SONOS type.

The columns COL of memory cells comprise pairs of twin memory cells $CEL_1$, $CEL_2$.

The non-volatile memory device IC, which is produced in an integrated manner, is intended, for example, to equip an electronic device APP, such as a mobile telephone or a hearing aid. Any known electronic device that is not mentioned herein also can be equipped with such a device IC.

FIG. 1 shows an embodiment of a pair of memory cells $CEL_1$, $CEL_2$ of the SONOS type for trapping charges in a dielectric interface having a vertical structure.

Figure 4:
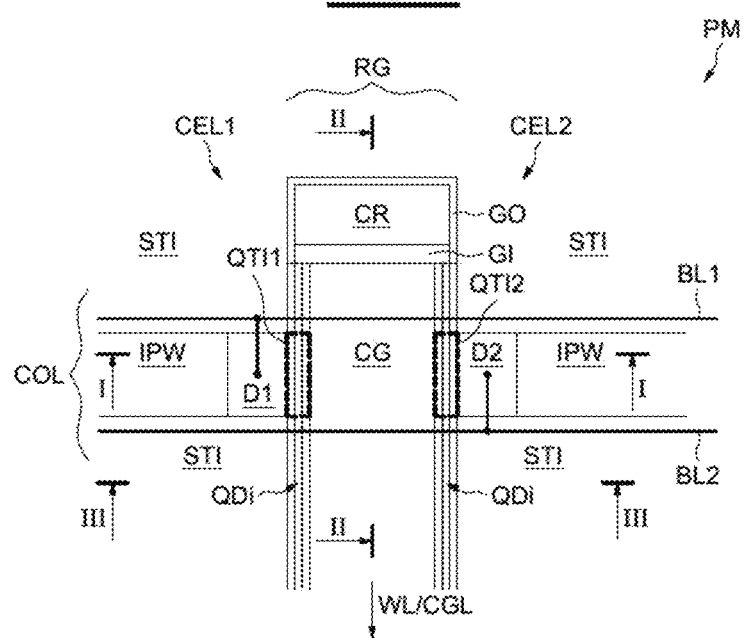

FIG. 1 is a section view in the I-I plane of FIG. 4.

The pair of memory cells can be produced in a semiconductor well IPW, incorporated in a carrier substrate PSUB, capable of being biased to high value voltages (of approximately 5 to 15 volts) and being of opposite sign.

According to one embodiment, the semiconductor well IPW in which said pair of memory cells $CEL_1$, $CEL_2$ is formed is an isolated well, of the "triple well" type, electrically isolated from the remainder of the carrier substrate PSUB by isolation areas.

Typically, the isolation areas of a triple well comprise an embedded layer NISO and lateral wells with a conductivity type that is opposite the conductivity type of the carrier substrate PSUB and of the triple well semiconductor IPW.

According to another embodiment, the carrier substrate PSUB is of the Fully-Depleted Silicon On Insulator (FD-SOI) hybrid type, i.e. an FDSOI well comprising a part in which the depleted silicon and the insulation have been removed, exposing the underlying carrier well in a "conventional" configuration that can receive the well IPW in which the pair of memory cells $CEL_1$, $CEL_2$ is formed.

In this type of hybrid FDSOI structure, a topological demarcation exists between the part in which the depleted silicon and insulation layers have been removed and the part in which the depleted silicon and insulation layers have not been removed, with the respective surfaces of these parts not being at the same height, making a "step" between them. This height difference can introduce constraints in the design and manufacturing steps, particularly in the manufacturing steps carried out concomitantly in the two parts, such as the steps requiring polishing to be carried out from the upper surfaces of layers deposited in the two parts.

However, as will be seen hereafter, manufacturing pairs of memory cells $CEL_1$, $CEL_2$ can be implemented separately from the steps of manufacturing other parts of the integrated circuit IC, for example, a logic part using CMOS technology. Thus, the manufacture of the pair of memory cells $CEL_1$, $CEL_2$ is not necessarily subject to the constraints introduced by the topological demarcation of a hybrid FDSOI well structure.

Each memory cell $CEL_1$, $CEL_2$ comprises a vertical state transistor $T_1$, $T_2$, which is embedded in a semiconductor well IPW and which particularly can be selected by a vertical selection transistor $ST_1$, $ST_2$ embedded in the well IPW. The vertical state transistor $T_1$, $T_2$ embedded in the well IPW comprises an embedded control gate CG and the vertical selection transistor $ST_1$, $ST_2$ embedded in the well IPW also comprises an embedded selection gate SG.

The pair of memory cells $CEL_1$, $CEL_2$ is formed in a trench vertically extending in the semiconductor well IPW.

The selection gate SG is common to the two selection transistors $ST_1$, $ST_2$ of the pair of twin memory cells $CEL_1$, $CEL_2$ and, similarly, the control gate CG is common to the two state transistors $T_1$, $T_2$ of the pair of twin memory cells $CEL_1$, $CEL_2$.

The common control gate CG is located above the common selection gate SG and both are thus "embedded" in the well IPW.

The common selection gate SG can comprise a conductive area such as a doped polycrystalline silicon, metal or silicide area. Similarly, the common control gate CG can comprise a conductive area such as a polycrystalline silicon, metal or silicide area.

The selection gate SG and the control gate CG are mutually electrically isolated by a gate isolation area GI.

The gate isolation area GI can be formed, for example, by growing a thick silicon oxide (such as silicon dioxide $SiO_2$), after depositing and etching the conductive area of the selection gate SG.

The selection gate SG area is also surrounded by a gate dielectric layer GO.

The gate dielectric layer GO, for example, made of silicon oxide, electrically isolates the selection gate SG area laterally with the well IPW, and also in the bottom of the trench with an embedded layer NISO forming a source area S. In the example of an isolated well IPW of the triple well type, the layer NISO forming the source area S advantageously can simultaneously form the embedded layer of the aforementioned isolation areas.

Such a source area S belonging to the embedded semiconductive area NISO located in the vicinity of the bottom of the trench is commonly denoted using the term "source plane".

This structure provided with a source plane NISO corresponds, according to one embodiment, to a memory configuration of the NOR type, advantageously allowing page erasures and advantageously using hot-carrier injection programming (see below with reference to FIG. 7).

Furthermore, each state transistor $T_1$, $T_2$ of a pair of twin memory cells $CEL_1$, $CEL_2$ comprises a respective drain area $D_1$, $D_2$ located in the vicinity of a front face FA delimiting an upper surface of the well IPW.

The drain areas $D_1$ and $D_2$ are located either side of the common control gate CG.

The gate dielectric layer GO is configured to allow the formation of a vertical channel area along the trench, between the source area S and the drain area $D_1$ or $D_2$, in the case of biasing as described hereafter with reference to FIG. 7.

The control gate area CG is also laterally surrounded by two dielectric areas QDi forming, on the sides of the common control gate area CG, two charge trapping dielectric interfaces $QTI_1$, $QTI_2$ between the control gate CG and the well IPW.

The charge trapping dielectric interfaces $QTI_1$ and $QTI_2$ are capable of permanently (or in a non-volatile manner, i.e. including in the absence of a power supply) and reversibly (i.e. the digital data can be modified by means of erasures and/or programming) storing a charge representing one or more item(s) of digital data.

Indeed, the dielectric areas QDi are configured to allow injections and extractions of electric charges in "traps" belonging to the charge trapping dielectric interfaces $QTI_1$, $QTI_2$, in the case of biasing as described hereafter with reference to FIG. 7. Charge extractions can involve injecting charges of the opposite sign.

The dielectric areas QDi forming said charge trapping dielectric interfaces $QTI_1$, $QTI_2$ have a first dielectric layer $Di_m$ intended to trap electric charges, surrounded by two second dielectric layers $Di_{21}$, $Di_{22}$.

The first dielectric layer $Di_{10}$ can comprise silicon nitride and the second dielectric layers $Di_{21}$, $Di_{22}$ can comprise silicon oxide.

For example, the second outer dielectric layer $Di_{21}$ (on the well IPW side) can comprise or be formed by the gate dielectric layer GO that surrounds the selection gate area SG and is previously deposited on the sides and the bottom of the exposed trench.

In other words, the gate dielectric layer GO can surround the trench on its bottom and over the full height of its sides and the second outer dielectric layer $Di_{21}$ comprises the part of the gate dielectric layer GO located facing the control gate area CG.

An additional formation of oxide can fulfil the requirement of completing the gate dielectric layer GO for forming the second outer dielectric layer $Di_{21}$ of the charge trapping interfaces $QTI_1$, $QTI_2$.

Furthermore, the gate isolation area GI can comprise part of a dielectric area QDi at the bottom of the conductive area of the control gate CG.

Indeed, the first dielectric layer $Di_{10}$ and the second dielectric layer $Di_{22}$ can be formed following the growth of the silicon oxide on the conductive area of the selection gate SG and form the gate isolation area GI in combination with the oxide thus grown.

In any event, the first dielectric layer Dim, the second dielectric layers $Di_{21}$, $Di_{22}$, the gate dielectric layer GO and the gate isolation area GI can be produced according to formations that are common to at least some of them, as well as according to formations that are independent and are respectively dedicated to each of them.

For example, in order to form the second dielectric layer $Di_{21}$, removing the gate dielectric layer GO after the formation of the selection gate SG and distributing the exposed silicon present on the sides of the trench also can be contemplated. The formation of the second dielectric layer $Di_{21}$ thus can also contribute to the formation of the gate isolation area GI.

The twin memory cells $CEL_1$, $CEL_2$ are thus denoted "twins" since they have said selection gate SG, said control gate CG and said source area S in the source plane NISO in common.

Figure 2:
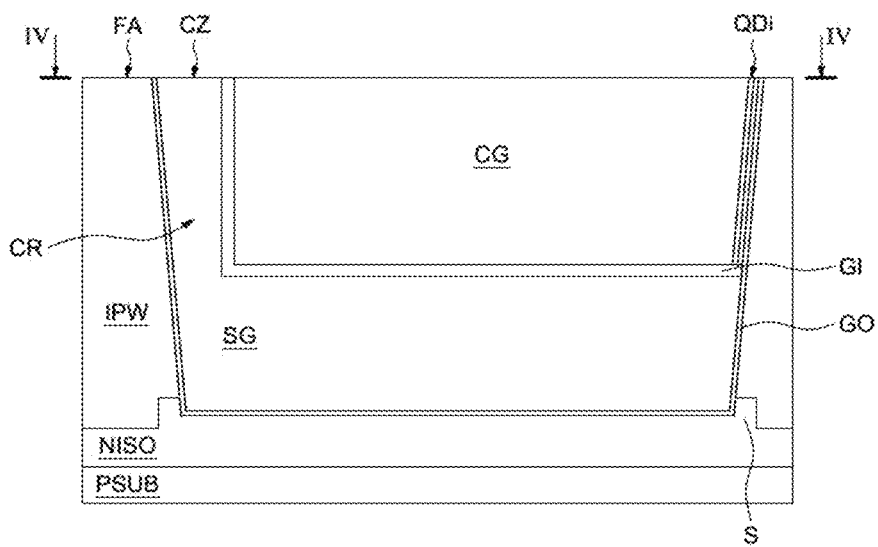

FIG. 2 shows a section view in the II-II plane of FIG. 4 of the pair of memory cells $CEL_1$, $CEL_2$, i.e. a vertical section view in the length of the trench, whereas FIG. 1 shows a vertical section in the width of the trench.

The common control gate CG is located above the common selection gate SG and below a front face FA delimiting an upper surface of the well IPW.

The conductive area of the selection gate SG further comprises a connection area CR providing electrical continuity between the common selection gate SG, located under the common control gate CG, and a contact zone CZ located in the vicinity of the front face FA of the well IPW.

In this example, the connection area CR is located at a longitudinal end of the trench, between the control gate CG and the well IPW.

The connection area CR is electrically isolated from the common control gate CG by the gate isolation layer GI extending vertically along said connection area CR.

The gate oxide GO surrounding the common selection gate SG electrically isolates the connection area CR from the well IPW.

Optionally, a dielectric spacer can be formed between the common control gate CG and the connection area CR in the vicinity of the front face FA in order to avoid electrical coupling or electrical short-circuits.

The structure comprising the selection gate SG (in the bottom of the trench) and the connection area CR (vertical) can be formed, for example, by depositing an excessive amount of a selection gate conductor material overflowing the trench on the front face FA; by Chemical-Mechanical Planarization (CMP) of this excessive amount to the level of the front face FA; by selective etching of the selection gate conductor material to the desired depth, with the selective etching being anisotropic and hidden in the vicinity of the surface of the connection column CR.

The contact zone CZ conventionally originates, for example, from silicification (in the case of a selection gate conductor material of the doped polycrystalline silicon type), in order to allow, for example, connection to a metal track routing biasing voltages of the selection gate SG.

Figure 3:
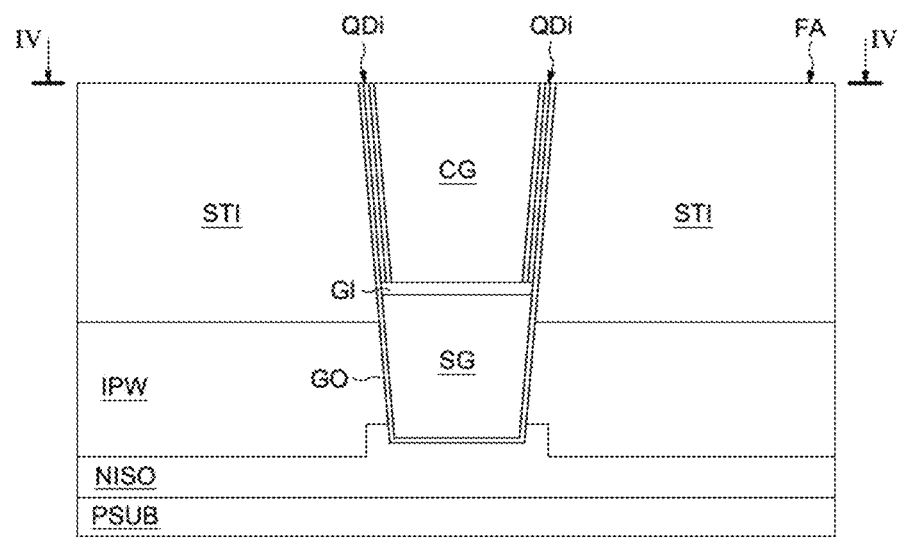

FIG. 3 shows a section view in the III-III plane of FIG. 4, i.e. a vertical section in the width of the trench, longitudinally offset relative to the I-I plane.

Indeed, while the I-I plane is located in part, called "active area", of the pair of memory cells $CEL_1$, $CEL_2$ in which the front face FA of the semiconductor well IPW is exposed and typically comprises integrated areas, the III-III plane is located outside the "active area", between two pairs of memory cells $CEL_1$, $CEL_2$ in a row, the semiconductor well IPW being covered at this location by lateral isolation areas STI.

The lateral isolation areas STI located on the surface of the well IPW, for example, of the "shallow isolation trench" type, conventionally allow lateral isolation of two "active areas" of neighbouring devices formed along the same trench.

The trench of the pair of memory cells $CEL_1$, $CEL_2$ extends perpendicular to said lateral isolation areas STI of the well IPW.

In this embodiment, the control gate CG extends less deeply in the well IPW than the lateral isolation areas STI.

Indeed, as will become apparent hereafter with reference to FIG. 4, such a configuration, in which the charge trapping dielectric interfaces are only adjacent to the semiconductor well IPW at the active areas, allows any diffusion of a parasitic current to be avoided between a line of selected bits and a neighbouring line of non-selected bits, along a selected line of words.

FIG. 4 shows a top view of the pair of memory cells $CEL_1$, $CEL_2$ in the memory plane PM in the vicinity of the front face FA delimiting an upper surface of the well IPW in the IV-IV plane of FIGS. 1, 2 and 3.

The memory plane PM comprises numerous memory cells that are arranged matrix-wise in rows RG and columns COL and are accessible via conductive lines, particularly word lines WL and control gate lines CGL, in the direction of the rows RG, and bit lines $BL_1$, $BL_2$, in the direction of the columns COL.

Given that the columns COL of memory cells comprise pairs of twin memory cells $CEL_1$, $CEL_2$, the memory plane PM comprises two bit lines $BL_1$, $BL_2$ per column COL of memory cells. The two memory cells $CEL_1$, $CEL_2$ of a pair of twin memory cells are also respectively connected to the two bit lines $BL_1$, $BL_2$ of the column COL.

FIG. 4 shows only one pair of memory cells $CEL_1$, $CEL_2$, the two bit lines $BL_1$, $BL_2$ of the respective column, as well as the respective word lines WL and control gate lines CGL.

The trench containing the common control gate CG and the common selection gate SG extends longitudinally in the direction of the rows RG of the memory plane PM. Even though they are not shown, other similar trenches are formed in parallel in the memory plane PM and other "active areas" are formed in parallel in the memory plane PM, along bit lines $BL_1$, $BL_2$. The pairs of memory cells $CEL_1$, $CEL_2$ are thus arranged matrix-wise at each "intersection" between a row RG and a column COL.

The word lines WL are advantageously formed by the conductive areas of the selection gate SG in the respective trenches and the control gate lines CGL are formed by the conductive areas of the control gate CG in the respective trenches.

The bit lines $BL_1$, $BL_2$ can, for their part, be formed by metal tracks extending above the memory plane PM in the direction of the columns COL and can be connected to the areas of respective drains $D_1$, $D_2$ of the two twin memory cells $CEL_1$, $CEL_2$.

Typically, vertical conducting vias allow the drain area $D_1$, $D_2$ to be electrically connected to the respective bit line $BL_1$, $BL_2$.

An example of the configuration of the memory plane PM, particularly in that it comprises two bit lines per column of memory cells, is disclosed in the patent application filed in the U.S. Ser. No. 15/810,979, in particular with reference to appended FIGS. 2 and 4 of said patent application, the entire content of which is incorporated.

FIG. 5 shows variations of the previously described embodiment.

In these variations, said charge trapping dielectric interfaces $QTI_1$, $QTI_2$ are located on a local part of the sides of the control gate CG.

According to one embodiment, the first dielectric layer $Di_{10}$ and the second inner dielectric layer $Di_{22}$ (on the control gate CG side) are formed in like manner to a conventional formation of gate spacers, i.e. by isotropic growth or deposition and anisotropic etching leaving a residue of the grown or deposited material on the vertical walls. Of course, in this case this etching would have been taken into account during the formation of the gate isolation area GI, which in this case is exposed to the anisotropic etching.

Thus, said charge trapping dielectric interfaces $QTI_1$, $QTI_2$ are located on a local part of the sides of the common control gate CG, in the vicinity of the common selection gate SG, for example, adjoining the gate isolation area GI and at a distance from a front face FA delimiting an upper surface of the well IPW.

Thus, the trapped charges will remain close to their initial injection zone, avoiding a phenomenon of spreading the location of the trapped charges, which can result from multiple writing operations and can degrade the performance of the device.

According to another embodiment, said charge trapping dielectric interfaces $QTI_1$, $QTI_2$ comprise silicon nanocrystals.

The charge trapping dielectric interfaces $QTI_1$, $QTI_2$ comprising silicon nanocrystals also can be located on the sides of the common control gate CG, in the vicinity of the common selection gate SG, for example, adjoining the gate isolation area GI and at a distance from a front face FA delimiting an upper surface of the well IPW.

For example, the silicon nanocrystals are obtained by means of partial chemical vapor deposition (CVD) of a polycrystalline silicon layer.

Thus, a silicon nanocrystal is, for example, a nanometric sized isolated silicon crystalline structure, such as a grain of polycrystalline silicon.

The nanocrystals thus act like a floating gate of a typical floating gate transistor, but with nanometric dimensions forming highly localized charge traps.

The use of such nanocrystals also allows the location of the trapped charges to be enhanced and also increases the amount of trappable charges.

FIG. 7 shows a table of examples of voltage values in volts (V) to be applied to the control gate CG, the selection gate SG, the drain area D, the source area S and the well IPW, in order to implement programming Wr, erasing Er and reading Rd of data in a memory cell. It is to be noted that the well IPW is of the well type that is electrically isolated from the remainder of the carrier well.

The term "drain area D" relates to the drain area $D_1$, $D_2$ of the state transistor $T_1$, $T_2$ of the respective memory cell $CEL_1$, $CEL_2$ of a pair of twin memory cells as previously described. Similarly, the term "charge trapping dielectric interface QTI" refers to the charge trapping dielectric interface $QTI_1$, $QTI_2$ of the respective memory cell $CEL_1$, $CEL_2$ of the pair of twin memory cells.

During programming Wr, electric charges are injected into the first dielectric layer Dim of the charge trapping dielectric interface QTI through the second outer dielectric layer (on the well IPW side)$Di_{21}$. The charges originate from a channel area formed in the well IPW along the trench between the source area S and the drain area D and are transmitted by an effect called source-side hot-carrier injection (or commonly called "SSI" (Source Side Injection)).

For example, the voltages that allow such hot-carrier injection are from 5 V to 10 V on the control gate CG; the sufficient selection gate voltage Vsg for forming a channel area in the well IPW along the selection gate SG (from 0.5 V to 3 V) is applied to the selection gate SG; from 3 V to 4.5 V on the drain area D; and 0 V on the source area S and in the well IPW.

This type of source side hot-carrier injection programming particularly offers the advantages of not requiring biasing of opposite signs, of having the physical granularity of one bit (one memory cell) and of being quick to execute.

During erasing, the charges previously injected and trapped in the charge trapping dielectric interface QTI can be extracted therefrom through the Fowler-Nordheim effect.

An electric field of approximately 15 MVcm$^{-1}$ between the control gate CG and the well IPW is sufficient to obtain the Fowler-Nordheim effect.

For example, voltages allowing the Fowler-Nordheim effect to be implemented that extracts the trapped charges are approximately −10 V on the control gate CG; and from 5 V to 10 V on the well IPW. Similarly, voltages of 5 V to 10 V possibly can be applied to the selection gate SG, the drain area D and the source area S. However, it is possible, particularly relative to the desired operation or reliability constraints, to leave some floating nodes (particularly the selection gate SG) or to apply different voltages to each of the nodes.

According to an alternative, extraction of the trapped charges can be implemented by opposite charge hot-carrier injection (denoted "hot-hole injection").

Given the configurations of the selection gate SG and control gate CG areas that circulate in the direction of the rows RG of the memory plane PM and the source areas S adjoining a common source plane NISO, the erasure voltages advantageously can be applied to a group of memory cells belonging to the same row RG, generally a page. This corresponds to advantageous memory technology called NOR memory.

When reading, a control gate voltage Vcg, which allows a channel area to be formed in the well IPW along the control gate CG, is applied to the control gate CG; a sufficient selection gate voltage Vsg rd for forming a channel area in the well IPW along the selection gate SG is applied to the selection gate SG; a low potential difference is applied between the drain area D and the source area S, meeting the requirements relating to the aforementioned voltages, for example, from 0.4 V to 0.7 V on the drain area D and 0 V on the source area S; and 0 V in the well IPW.

When charges are trapped in the charge trapping dielectric interface, they form a screen for the control gate potential (at the reading voltage Vcg) and disrupt the formation of the channel area.

A lack of trapped charges in the charge trapping dielectric interface does not form a control gate potential screen (at the reading voltage Vcg), allowing the channel area to be formed without any disruption.

Thus, a measurement of a source-drain current, which is intended to flow in a formed channel area, allows the digital information stored by the read memory cell to be obtained.

Such voltages can be generated, for example, by charge pumps and can be distributed to said gate CG, SG and drain D and source S areas by control and distribution means and can be routed via the aforementioned control gate CGL, word WL and bit $BL_1$, $BL_2$ lines.

Of course, the values of the voltages have been provided by way of an example of an order of magnitude and are by no means limiting. Furthermore, the invention is not limited to the previously described embodiments but includes all variations and combinations.

FIGS. 8A-8F and 9A-9F illustrate a semiconductor memory during various stages of fabrication in accordance with embodiments of the present invention. FIGS. 8A-8F correspond to the section view in the I-I plane of FIG. 4 while FIGS. 9A-9F illustrate the corresponding semiconductor memory along the section view in the II-II plane of FIG. 4.

Figure 9A:
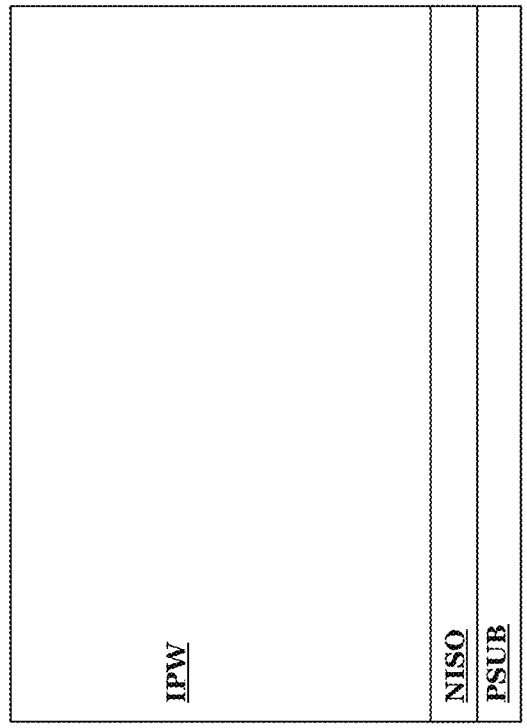
Figure 8A:
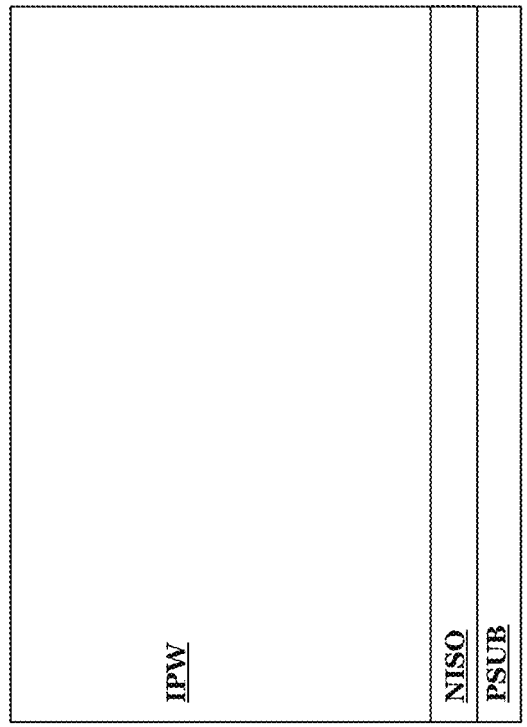

Referring to FIGS. 8A and 9A, a pair of memory cells can be produced in a semiconductor well IPW, incorporated in a carrier substrate PSUB. According to one embodiment, the semiconductor well IPW is an isolated well, of the "triple well" type, electrically isolated from the remainder of the carrier substrate PSUB by isolation areas.

The isolation areas of a triple well may comprise an embedded layer NISO and lateral wells with a conductivity type that is opposite the conductivity type of the carrier substrate PSUB and of the triple well semiconductor well IPW.

Figure 9B:
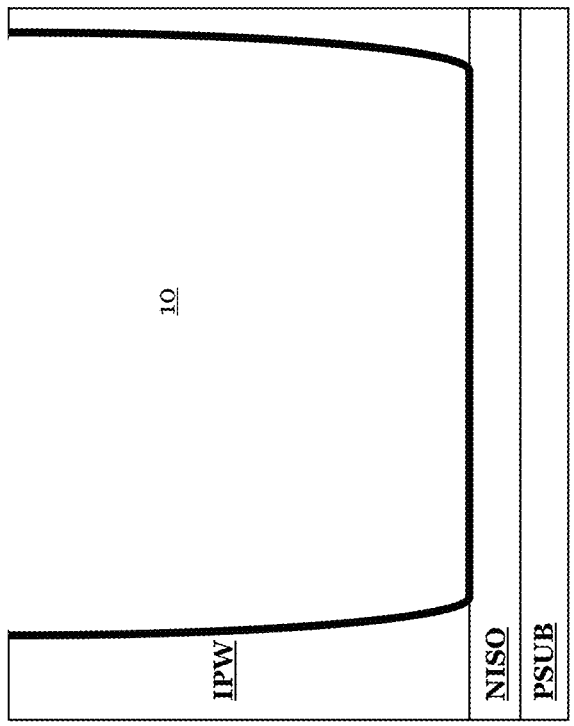
Figure 8B:
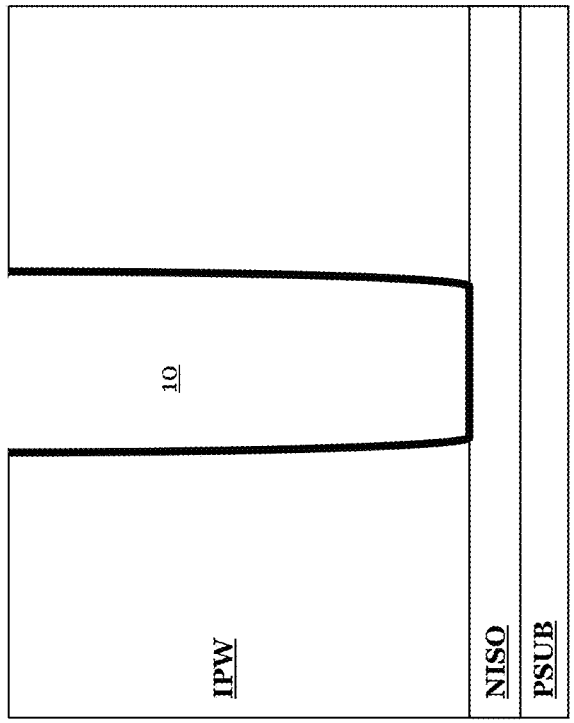

Referring to FIGS. 8B and 9B, a trench etch is performed to form trenches 10. As illustrated in FIGS. 8C and 9C, a source implant may be implanted through the trenches 10 to form source regions 15 thereby the source plane discussed above. After depositing a gate dielectric layer GO, a first conductive material 20 such as polysilicon, metal, or silicide, is deposited into the trenches 10, which eventually forms the selection gate. The first conductive material 20 is overfilled.

Referring to FIGS. 8D and 9D, the exposed first conductive material 20 is etched to form a partially filled trench 30 and a contact area 25. In another embodiment, the exposed first conductive material 20 is planarized with a chemical mechanical polishing process followed by an etching process. In some embodiments, the partially filled trench 30 may be formed directly with the deposition of the first conductive material 20.

Referring to FIGS. 8E and 9E, a gate isolation area GI is deposited into the partially filled trench 30. As described earlier, the gate isolation area GI can be formed, for example, by growing a thick silicon oxide (such as silicon dioxide $SiO_2$) over the first conductive material 20.

Dielectric areas QDi are formed along the sidewalls of the partially filled trench 30. The dielectric areas QDi include a first dielectric layer Dim intended to trap electric charges, and is surrounded by two second dielectric layers $Di_{21}$, $Di_{22}$. In one embodiment, the first dielectric layer $Di_{10}$ can comprise silicon nitride and the second dielectric layers $Di_{21}$, $Di_{22}$ can comprise silicon oxide. For example, the second outer dielectric layer $Di_{21}$ (on the well IPW side) can comprise or be formed by the gate dielectric layer GO that surrounds the selection gate area SG and is previously deposited on the sides and the bottom of the exposed trench 10.

A second conductive material 40 such as polysilicon, metal, or silicide, is deposited into the partially filled trench 30 over the dielectric areas QDi. The second conductive material 40 may be overfilled to ensure that the partially filled trench 30 is completely filled.

Figure 9F:
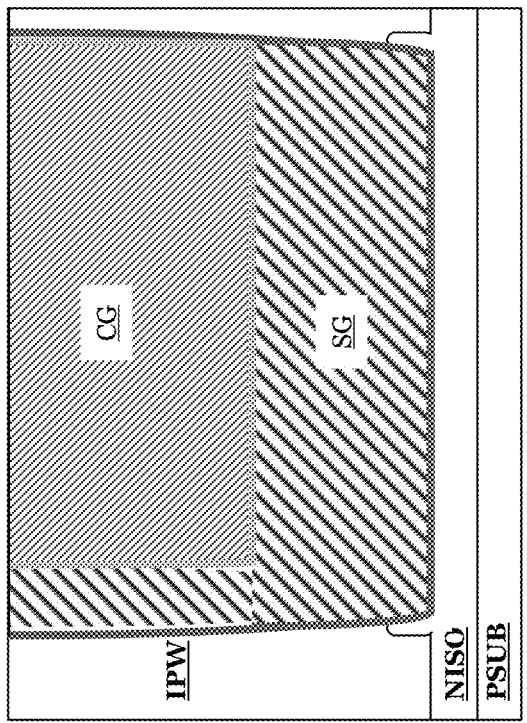
Figure 8F:
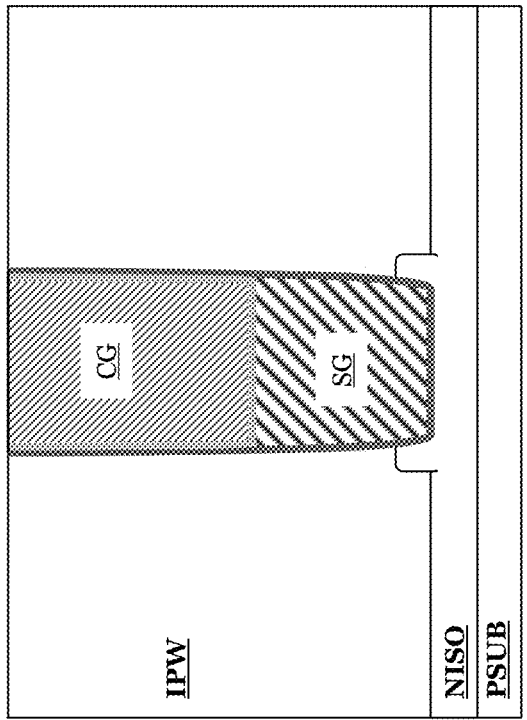

As next illustrated in FIGS. 8F and 9F, a planarization followed by etching process is used to remove the overfilled second conductive material 40 thereby forming a control gate CG. Alternately, a direct etching process may be sufficient in some embodiments. In some embodiments, a spacer may be added to the have reliable separation between the contact area 25 and the control gate CG. Further processing may continue as in conventional processing, for example, to form drain regions and contacts. The structures illustrated in FIGS. 8F and 9F correspond to FIGS. 1 and 2 respectfully.

What is claimed is:

1. A non-volatile memory device comprising:
a vertical state transistor disposed in a semiconductor substrate, the vertical state transistor being configured to trap charges in a dielectric interface between a semiconductor well and a control gate;
a vertical selection transistor disposed in the semiconductor substrate, the vertical selection transistor being disposed under the state transistor, the vertical selection transistor being configured to select the state transistor; and
a trench disposed in the semiconductor well, the trench comprising an upper portion and a lower portion, the upper portion comprising the control gate of the vertical state transistor and the lower portion comprising a selection gate of the vertical selection transistor, wherein the dielectric interface is disposed on sidewalls of the upper portion of the trench, each of the vertical state transistor and the vertical selection transistor having an associated current conduction path oriented in a substantially vertical direction along the trench.

2. The device according to claim 1, further comprising:
a gate dielectric layer disposed on sidewalls of the lower portion of the trench;
the selection gate disposed in the lower portion of the trench over the gate dielectric layer; and
a gate isolation area disposed between the control gate and the selection gate.

3. The device according to claim 2, wherein the gate dielectric layer and the dielectric interface share a common layer extending along an entire sidewall of the trench.

4. The device according to claim 1, further comprising:
a source plane disposed in the semiconductor substrate at the bottom of the trench.

5. The device according to claim 4, wherein the source plane comprises a source implant at the bottom of the trench.

6. The device according to claim 1, wherein the dielectric interface comprises a oxide/nitride/oxide layers.

7. A non-volatile memory device comprising:
a memory plane comprising rows and columns of memory cells, the columns comprising twin memory cell units, each of the twin memory cell units comprising:
two vertical selection transistors having a common selection gate,
two vertical state transistors having a common control gate superposing the common selection gate,
two charge trapping dielectric interfaces disposed on either side of the control gate, the two charge trapping dielectric interfaces respectively dedicated to each of the twin memory cell units, each of the two charge trapping dielectric interfaces comprising a dielectric area located between the common control gate and a semiconductor well; and
a connection area providing electrical continuity between the selection gate and a contact area located in a vicinity of the major surface of the semiconductor well, the connection area located between the control gate and shallow trench isolation regions, each of the vertical state transistors and each of the vertical selection transistors having an associated current conduction path oriented in a substantially vertical direction.

8. The device of claim 7, wherein each of the vertical state transistors comprises a drain area located at a major surface of the semiconductor well.

9. The device of claim 7, wherein each of the two vertical selection transistors comprises a source area located in a vicinity of the bottom of the common selection gate.

10. The device of claim 7, wherein the memory plane comprises two bit lines per column of memory cells, the two memory cells of the twin memory cells being respectively connected to the two bit lines.

11. The device of claim 7, wherein the semiconductor well comprises lateral isolation areas, in which the control gate (CG) extends less deeply in the semiconductor well than the lateral isolation areas.

12. The device of claim 7, wherein the two charge trapping dielectric interfaces are each located on a local part of the sides of the common control gate, in a vicinity of the common selection gate and at a distance from the major surface of the semiconductor well.

13. The device of claim 12, wherein the two charge trapping dielectric interfaces comprise silicon nanocrystals.

14. The device of claim 7, wherein the dielectric area of each of the two charge trapping dielectric interfaces comprises a first dielectric layer to trap electric charges, surrounded by two second dielectric layers.

15. The device of claim 14, wherein the control gate comprises polycrystalline silicon, the first dielectric layer comprises silicon nitride and the second dielectric layers comprise silicon oxide.

16. A non-volatile memory device comprising:
a trench extending vertically in a semiconductor substrate and extending along a first direction parallel to a major surface of the semiconductor substrate, the trench having a first portion in a semiconductor well and a second portion in a shallow trench isolation along the first direction;
a source region disposed at the bottom of the trench;
a gate dielectric layer disposed around sidewalls of the trench;
a selection gate disposed within the trench, the gate dielectric layer disposed between the semiconductor well and the selection gate;
a dielectric area disposed on sidewalls of the trench above the selection gate, the dielectric area comprising two charge trapping dielectric interfaces; and
a control gate disposed within the trench above the selection gate, the control gate being laterally surrounded by the two charge trapping dielectric interfaces, the control gate being electrically isolated from the selection gate by a gate isolation area.

17. The device of claim 16, further comprising:
a connection area located at a longitudinal end of the trench in the second portion of the trench, the connection area providing electrical connection between the selection gate and a contact area at a major surface of the semiconductor substrate.

18. The device of claim 17, wherein the connection area having four sides, wherein one of the sides is electrically isolated from the control gate by the gate isolation area and the remaining three sides are surrounded by the shallow trench isolation.

19. The device of claim 16, further comprising two drain areas adjoining the trench, on either side of the trench, at the major surface of the semiconductor substrate.

20. The device of claim 16, further comprising an embedded semi-conductive area located at the bottom of the trench, the embedded semi-conductive area including the source region.

21. The device of claim 16, wherein the two charge trapping dielectric interfaces are disposed only on a bottom portion of the control gate.

* * * * *